US008663397B1

(12) United States Patent
Kahlon et al.

(10) Patent No.: US 8,663,397 B1
(45) Date of Patent: Mar. 4, 2014

(54) PROCESSING AND CLEANING SUBSTRATES

(71) Applicant: Intermolecular, Inc., San Jose, CA (US)

(72) Inventors: Satbir Kahlon, Livermore, CA (US); Jeffrey Chih-Hou Lowe, Cupertino, CA (US); Frank C. Ma, Scotts Valley, CA (US); Sandeep Mariserla, Danbury, CT (US); Robert Anthony Sculac, Lake Oswego, OR (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/657,261

(22) Filed: Oct. 22, 2012

(51) Int. Cl.
*B08B 3/04* (2006.01)

(52) U.S. Cl.
USPC ............... 134/26; 134/30; 134/32; 134/33; 134/34; 134/35; 134/36; 134/42; 134/902; 422/552; 506/23; 506/40; 436/49

(58) Field of Classification Search
USPC ........... 422/552; 506/23, 40; 436/49; 134/26, 134/30, 32, 33, 34, 35, 36, 42, 902
See application file for complete search history.

(56) References Cited

U.S. PATENT DOCUMENTS

| 5,356,756 | A | 10/1994 | Cavicchi et al. |
| 5,603,351 | A | 2/1997 | Cherukuri et al. |
| 6,063,633 | A | 5/2000 | Willson, III |
| 6,821,909 | B2 | 11/2004 | Ramanathan et al. |
| 6,821,910 | B2 | 11/2004 | Adomaitis et al. |
| 6,837,967 | B1 | 1/2005 | Berman et al. |
| 7,867,904 | B2 * | 1/2011 | Chiang et al. ............. 438/679 |
| 2003/0032198 | A1 | 2/2003 | Lugmair et al. |
| 2003/0049862 | A1 | 3/2003 | He et al. |
| 2004/0245214 | A1 | 12/2004 | Katakabe et al. |
| 2006/0258128 | A1 | 11/2006 | Nunan et al. |
| 2007/0082487 | A1 * | 4/2007 | Chiang et al. ............. 438/687 |
| 2007/0131247 | A1 * | 6/2007 | Blalock .......................... 134/2 |
| 2009/0061108 | A1 * | 3/2009 | Endo et al. ................ 427/569 |
| 2009/0068849 | A1 | 3/2009 | Endo et al. |
| 2009/0163383 | A1 * | 6/2009 | Sun et al. .................... 506/27 |
| 2009/0212019 | A1 | 8/2009 | Fuentes |
| 2011/0230054 | A1 * | 9/2011 | Tomita et al. ............ 438/758 |
| 2012/0074096 | A1 * | 3/2012 | Chiang et al. .............. 216/37 |
| 2012/0074101 | A1 * | 3/2012 | Nakamura .................. 216/83 |
| 2013/0133701 | A1 * | 5/2013 | Kahlon et al. ............. 134/30 |
| 2013/0133704 | A1 * | 5/2013 | Kahlon et al. ............. 134/83 |

OTHER PUBLICATIONS

Semancik, S., et al.; Microhotplate Platforms for Chemical Sensor Research; 2001; Elsevier Science B.V.; Sensors and Actuators B; pp. 579-591.

(Continued)

*Primary Examiner* — Bibi Carrillo

(57) ABSTRACT

The embodiments describe methods for controlling the particles generated when cleaning and drying a wafer in a spin rinse dryer (SRD) module. In some embodiments, the substrate surface is cooled by dispensing deionized (DI) water across the surface of the substrate, while the substrate rests on the SRD chuck. In addition, a method for controlling the particles generated when sleeves in a processing module or SRD contact a substrate surface during a clamping operation or when the sleeves are removed from the substrate surface is provided. A bottom edge or lip of the sleeves and/or the surface of the wafer contacting the sleeve is wetted during clamping/unclamping operations. Alternatively, the substrate may be wetted prior to clamping/unclamping operations.

6 Claims, 6 Drawing Sheets

(56) References Cited

OTHER PUBLICATIONS

Xia, B., et al.; Balancing Reactor Fluid Dynamics and Deposition Kinetics to achieve Composition Variation in Combinatorial Chemical Vapor Depositions; 2003; Elsevier B.V.; Applied Surface Science; pp. 14-19.

Flamac; High-Throughput Formulation, Application and Screening of High Viscous Solutions/Dispersions/Pastes (SDP); Flamac VZW; http://www.flamac.be/wp-content/uploads/2010/01/sdp_introduction2.pdf.

* cited by examiner

PROCESSING AND CLEANING SUBSTRATES

BACKGROUND

Combinatorial processing enables rapid evaluation of semiconductor processes. The systems supporting the combinatorial processing are flexible to accommodate the demands for running the different processes either in parallel, serial or some combination of the two.

Some semiconductor wet processing operations include operations for adding (electro-depositions) and removing layers (etch), defining features, preparing layers (e.g., cleans), etc. Similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the processing systems are designed to support this processing scheme. This approach has resulted in ever escalating R&D costs and the inability to conduct extensive experimentation in a timely and cost effective manner. Combinatorial processing as applied to semiconductor manufacturing operations enables multiple experiments to be performed on a single substrate.

During combinatorial experiments it is beneficial to provide as much flexibility as possible with regard to the tools performing the processing. In addition, the equipment for performing the combinatorial experiments should be designed to minimize particle generation. It is within this context that the embodiments arise.

SUMMARY

In some embodiments, a method for cleaning a substrate having a plurality of regions defined thereon includes combinatorially processing the substrate where different site isolated regions are processed differently. The method includes dispensing a cleaning chemistry onto a surface of the substrate while the substrate rests upon a chuck. The cleaning chemistry is at a temperature elevated from an ambient temperature. The method includes wetting a surface of the substrate for a period of time with a wetting agent while the substrate rests upon the chuck, wherein a temperature of the wetting agent is at or substantially near ambient temperature. The method includes drying the surface of the substrate, and transferring the substrate to a processing module.

In some embodiments, a method for cleaning a substrate is provided. The method includes receiving the substrate into a cleaning module and dispensing a cleaning chemistry onto a surface of the substrate. The cleaning chemistry is at a temperature elevated from an ambient temperature. The method includes terminating dispensing of the cleaning chemistry and dispensing a fluid onto the surface of the substrate where the fluid is at ambient temperature. The method includes terminating dispensing of the fluid after a predetermined time period, and rotating the substrate after terminating dispensing of the fluid.

These and further aspects of the invention are described more fully below.

DETAILED DESCRIPTION

Figure 1:
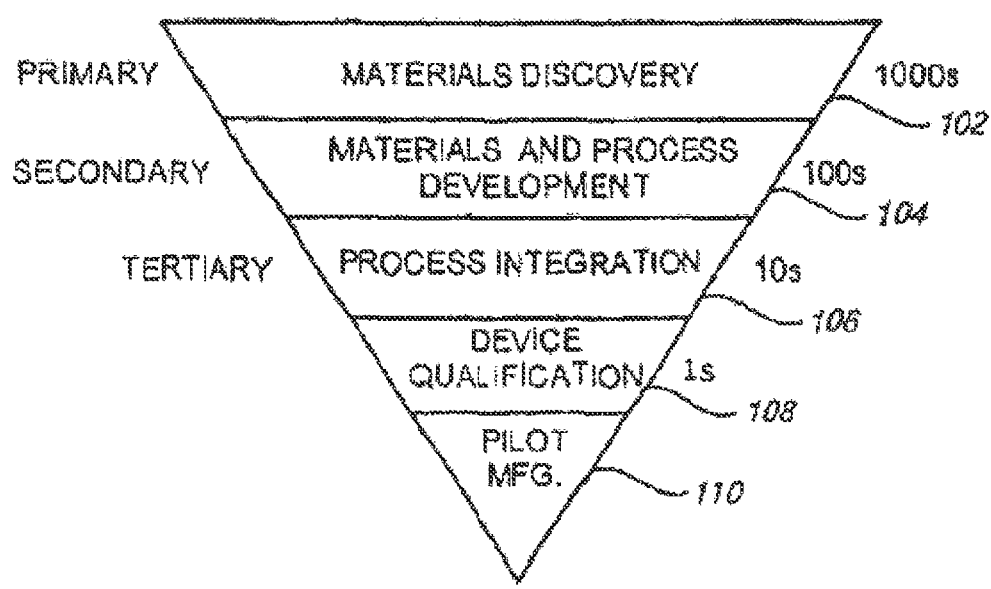
FIG. 1 illustrates a simplified schematic diagram providing an overview of the High-Productivity Combinatorial (HPC™) screening process for use in evaluating materials, unit processes, and process sequences for the manufacturing of semiconductor devices in accordance with some embodiments.

The following description is provided as an enabling teaching of the invention and its best, currently known embodiments. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances, and are a part of the invention. Thus, the following description is provided as illustrative of the principles of the embodiments of the invention and not in limitation thereof, since the scope of the invention is defined by the claims.

The embodiments describe methods and apparatuses for controlling particles generated when cleaning and drying a substrate. For example, a major source of particles is the presence of vapors in a spin rinse dryer (SRD) chamber that are generated from heated chemistry. The embodiments describe methods for controlling the particles generated when cleaning and drying a wafer in a SRD module. In some embodiments, the substrate surface is cooled by dispensing deionized (DI) water across the surface of the substrate, while the substrate rests on the SRD chuck. The DI water may be dispensed for about 10-60 seconds in some embodiments. The DI water is dispensed after the heated chemistry has been dispensed on the surface of the substrate but prior to the beginning of the dry cycle. In some embodiments, the DI water is at about room temperature and cools the substrate and the SRD chuck the substrate rests upon. The dry cycle consists of spinning the wafer while on the SRD chuck. In addition a method for controlling the particles generated when sleeves in a processing module or SRD contact a wafer surface during clamping and unclamping operations. A bottom edge or lip of the sleeves and/or the surface of the wafer contacting the sleeve is wetted during clamping/unclamping operations. The wetting agent is DI water in some embodiments. Alternatively, the substrate may be wetted prior to clamping/unclamping operations.

Furthermore, the embodiments described herein may be integrated with combinatorial processing techniques described in more detail below.

Semiconductor manufacturing typically includes a series of processing steps such as cleaning, surface preparation, deposition, patterning, etching, thermal annealing, and other related unit processing steps. The precise sequencing and integration of the unit processing steps result in functional devices meeting desired performance metrics such as efficiency, power production, and reliability.

As part of the discovery, optimization and qualification of each unit process, it is desirable to be able to (i) test different materials, (ii) test different processing conditions within each unit process module, (iii) test different sequencing and integration of processing modules within an integrated processing tool, (iv) test different sequencing of processing tools in executing different process sequence integration flows, and combinations thereof in the manufacture of devices such as integrated circuits. In particular, there is a need to be able to test (i) more than one material, (ii) more than one processing condition, (iii) more than one sequence of processing conditions, (iv) more than one process sequence integration flow, and combinations thereof, collectively known as "combinatorial process sequence integration," on a single monolithic substrate without the need for consuming the equivalent number of monolithic substrates per materials, processing conditions, sequences of processing conditions, sequences of processes, and combinations thereof. This can greatly improve both the speed and reduce the costs associated with the discovery, implementation, optimization, and qualification of materials, processes, and process integration sequences required for manufacturing.

High Productivity Combinatorial (HPC) processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Systems and methods for HPC processing are described in U.S. Pat. No. 7,544,574, filed on Feb. 10, 2006; U.S. Pat. No. 7,824,935, filed on Jul. 2, 2008; U.S. Pat. No. 7,871,928, filed on May 4, 2009; U.S. Pat. No. 7,902,063, filed on Feb. 10, 2006; and U.S. Pat. No. 7,947,531, filed on Aug. 28, 2009 each of which is incorporated by reference herein. Systems and methods for HPC processing are further described in U.S. patent application Ser. No. 11/352,077, filed on Feb. 10, 2006; U.S. patent application Ser. No. 11/419,174, filed on May 18, 2006; U.S. patent application Ser. No. 11/674,132, filed on Feb. 12, 2007; and U.S. patent application Ser. No. 11/674,137, filed on Feb. 12, 2007. The aforementioned patent applications claim priority from provisional patent application 60/725,186 filed Oct. 11, 2005. Each of the aforementioned patent applications and the provisional patent application are incorporated by reference herein.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (e.g., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated by reference in its entirety. Portions of the '137 application have been reproduced below to enhance the understanding of the embodiments disclosed herein. The embodiments disclosed enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as material characteristics of components utilized within the unit manufacturing operations. Rather than only considering a series of local optimums, i.e., where the best conditions and materials for each manufacturing unit operation is considered in isolation, the embodiments described below consider effects of interactions introduced due to the multitude of processing operations that are performed and the order in which such multitude of processing operations are performed when fabricating a device. A global optimum sequence order is therefore derived, and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform throughout each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameters (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
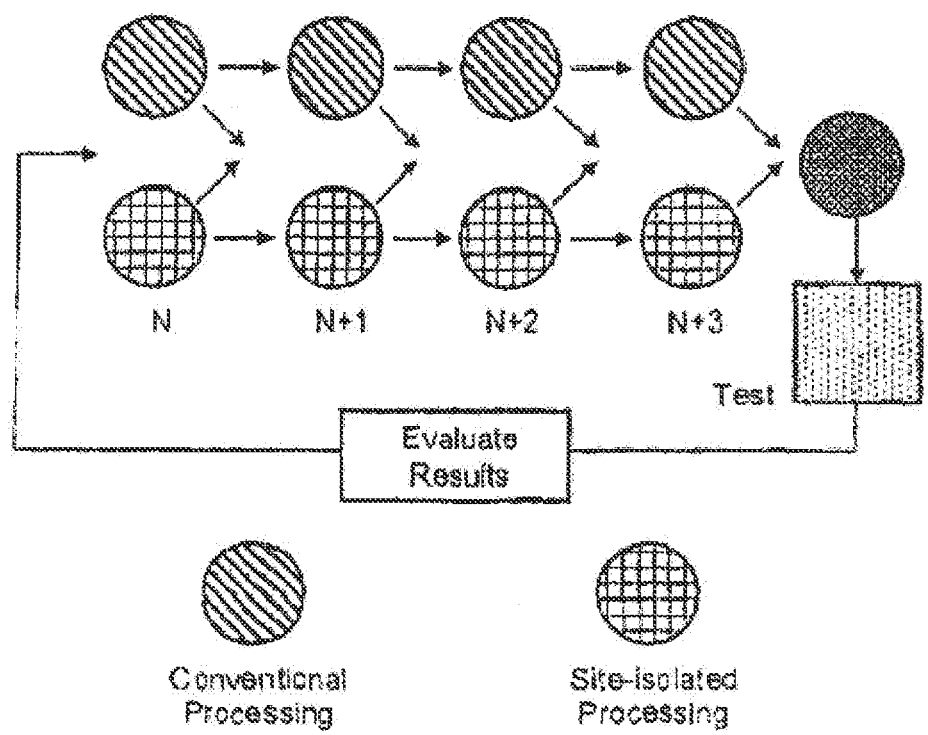
FIG. 2 illustrates a flowchart of a general methodology for combinatorial process sequence integration that includes site-isolated processing and/or conventional processing in accordance with some embodiments.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein perform the processing locally in a conventional manner, i.e., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

As stated above, under combinatorial processing operations the processing conditions at different regions can be controlled independently. According to some embodiments of the present invention, cleaning processes which reduce or mitigate the possibility for unwanted particle deposition onto one, more, or all of these different regions are provided.

Figure 3:
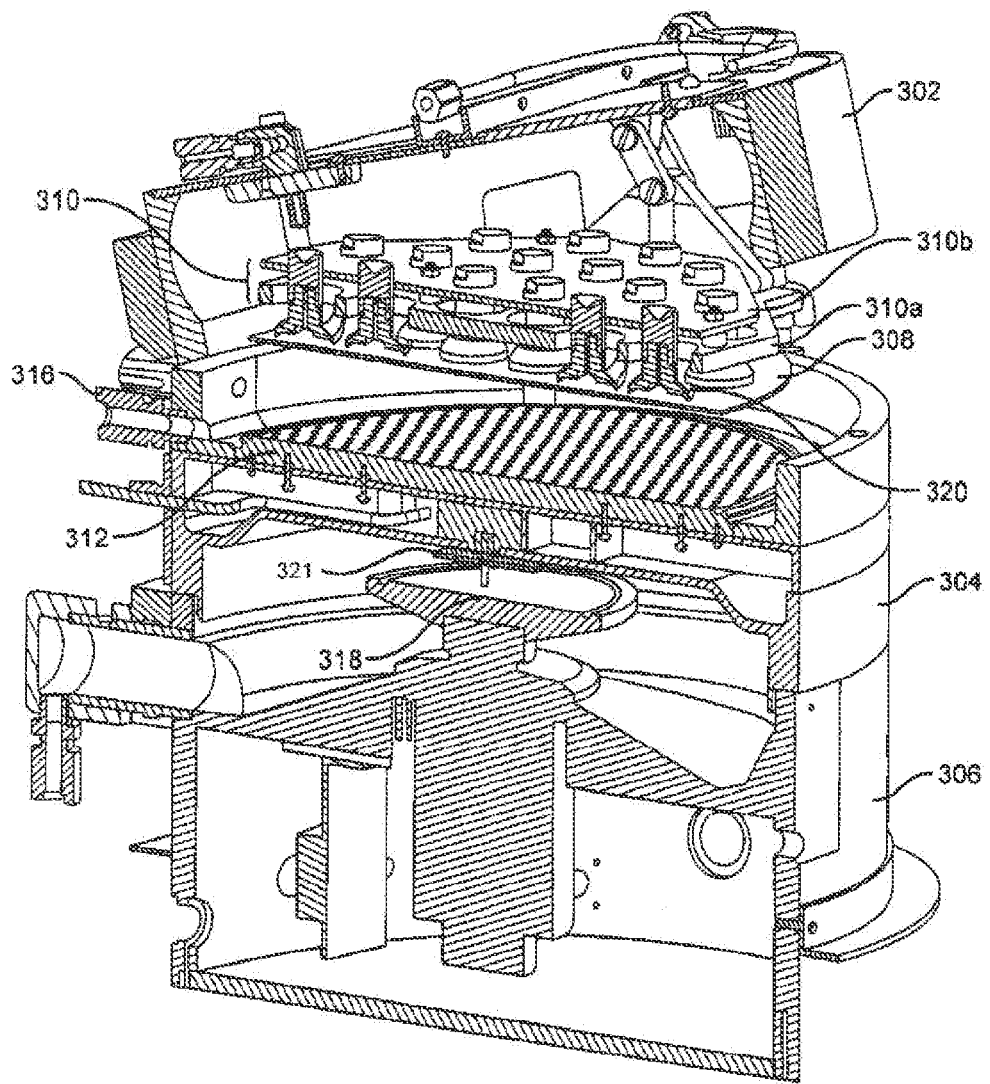
FIG. 3 is a simplified schematic diagram illustrating a cross-sectional view of a multi-module cleaning chamber in accordance with some embodiments.

FIG. 3 is a simplified schematic diagram illustrating a cross-sectional view of a multi-module cleaning system in accordance with some embodiments. Support assembly 310 includes top plate 310b disposed over bottom plate 310a. Top plate 310b has a plurality of holes disposed therethrough.

Cups 320 are disposed through the plurality of holes within top plate 310b and a plurality of holes in top plate 310b that are substantially aligned with corresponding holes of the bottom plate 310a. Substrate 308 is supported through cups 320, as will be described in more detail below. When lid 302 is in a closed position a bottom surface of substrate 308 will rest against chuck 312. Fitting 316 allows a fluid flow to exit from the top cleaning module in some embodiments. As mentioned above, mid portion 304 functions as a bottom to the top cleaning module and a top portion of the bottom cleaning module. The bottom cleaning module 306, which includes a base, functions as an SRD module in some embodiments. The SRD module includes chuck 318 that supports and rotates a substrate during a cleaning operation and a showerhead 321 disposed on a bottom surface of mid portion 304. The cleaning of the substrate in the SRD module utilizes cleaning chemistries at elevated temperatures, where the cleaning chemistries are delivered to a surface of a substrate being processed. It should be appreciated that the cleaning chemistries may be delivered through a nozzle or other suitable delivery mechanism. The elevated temperatures cause condensation to form on the ambient temperature surface of the ceiling of the SRD module, which in this embodiment is a bottom surface of mid-portion 304. The condensation on the ceiling of the SRD may cause droplets to form which can fall onto the surface of the substrate and introduce contaminants. In addition, during the dry cycle, the substrate's outer periphery about 3-inches from the edge of wafer cools down at a faster rate as compared to the substrate area above SRD chuck 318. As chuck 318 is still relatively hot due to the elevated temperature of the dispensed chemistry, chuck 318 radiates heat back to the substrate due to the mass of the chuck. Where the substrate makes contact with chuck 318, the substrate stays at an elevated temperature for a longer time period as compared to the portion of the substrate that overhangs from the periphery of chuck 318. The portion of the substrate that is relatively hot around the center of the substrate contacting chuck 318 is not exposed to vapor condensation due to the elevated temperature, relative to the outer periphery of the substrate. However, the substrate area where chuck 318 is not in contact with a surface of the substrate, i.e., the outer periphery of the substrate, cools down to room temperature and is exposed to vapor condensation due to the lower temperature. Vapor condensed on the substrate shows up as particles in the form of a ring around the periphery of the substrate.

Lid 302 is shown in an open position and may be supported through a hinge and support cylinder in some embodiments. In the open position, the top portion 302 of the cleaning module allows access for a substrate to be delivered so that support assembly 310 may couple to the substrate. Support assembly 310 supports a plurality of cups 320, where cups 320 have a bottom sealing surface that isolates regions of the substrate when the sealing surface contacts the substrate surface. In some embodiments, an end effector may be used to transport a substrate to and from the cleaning module, as well as between the top portion 302 of the cleaning module and bottom portion 306 of the cleaning module. Mid portion 304 functions as a base for the top portion 302 of the cleaning module and a lid for the bottom portion 306 of the cleaning module. When in an open position, bottom portion 306 of the cleaning module enables access for a substrate to be placed on chuck 318. It should be appreciated that one operation may include isolating the combinatorially processed regions of a substrate in the top cleaning module and cleaning the areas external to the processed regions of the substrate in the top cleaning module. After the cleaning operation in the top portion 302 of the cleaning module the substrate is transported to the bottom portion 306 of the cleaning module for a spin rinse and dry (SRD) operation. Controller 309 is in communication with the cleaning system and is operable to process computer readable instructions that cause the cleaning system to clean a substrate as described herein. For example, the functionality described with reference to FIGS. 5 and 6 may be embodied as computer readable instructions that can be executed by controller 309.

It should be appreciated that the material of construction for support assembly 310 and the cups 320, chuck 312, and chuck 318 may be any suitable material compatible with the cleaning fluids and operations, such as plastic, e.g., a fluoropolymer in some embodiments. In some embodiments, the chucks, linkages, covers and plates described herein are composed of Ethylene chlorotrifluoroethylene (ECTFE), the tubing is composed of Perfluoroalkoxy (PFA) PTFE: the basins and lid are composed of polytetrafluoroethylene (PTFE), and the o-rings are composed of a Perfluorinated Elastomer. Further details on the multi cleaning module may be found in U.S. application Ser. No. 13/086,327 entitled "In-Situ Cleaning Assembly" and filed on Apr. 13, 2011, which is incorporated by reference.

Figure 4:
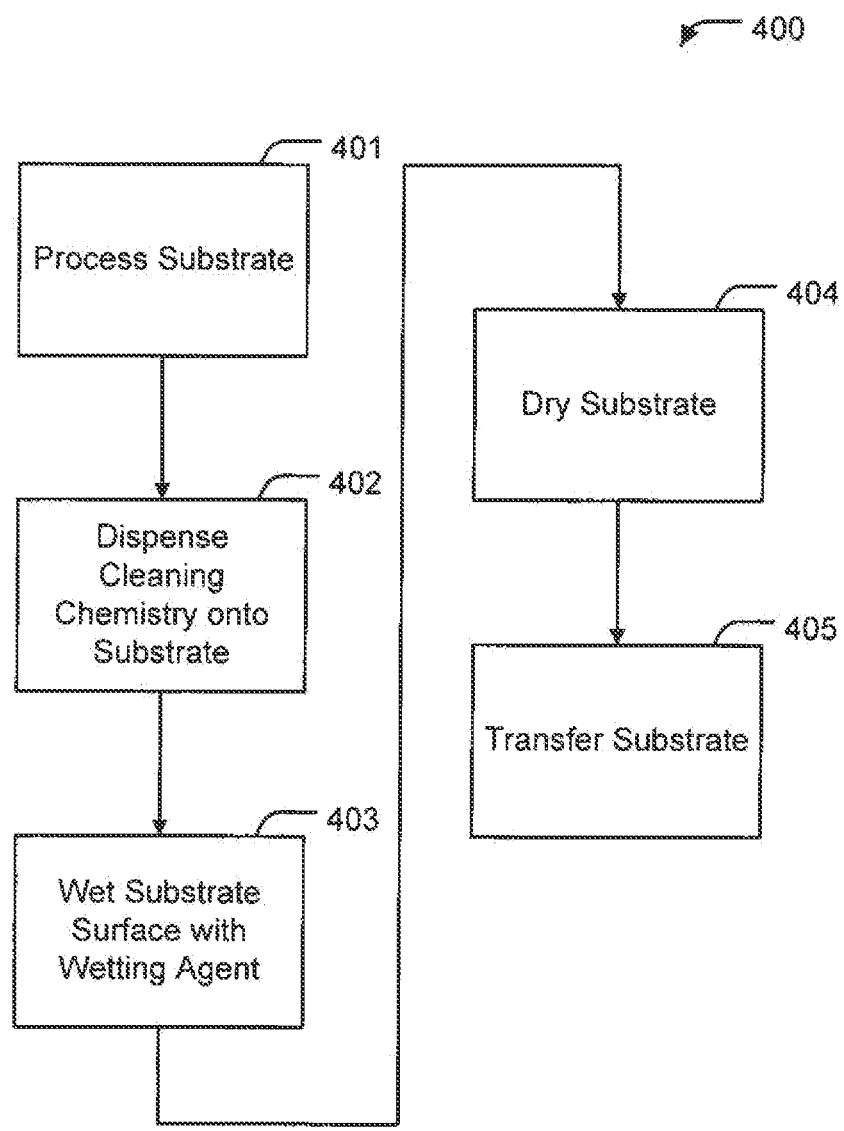
FIG. 4 illustrates a flowchart of a method of processing a substrate, according to some embodiments.

According to some embodiments, a process step to cool the substrate to a uniform temperature across the surface of the substrate may be integrated into a combinatorial process. For example, FIG. 4 illustrates a flowchart of a method of processing a substrate that minimizes particles.

The method 400 includes receiving the substrate in a cleaning module at block 401. The substrate may be received from a combinatorial processing module where the contact points of the sleeves are pre-wetted or where the substrate surface is pre-wetted during a clamping and/or unclamping process as described below with regard to FIGS. 5 and 6. In some embodiments the substrate is processed in a combinatorial processing module as described above with reference to FIGS. 1 and 2. The cleaning module of method 400 may be a spin-rinse-dryer (SRD), such as the SRD module of FIG. 3 in some embodiments. The substrate may be processed in a top portion of the cleaning module of illustrated in FIG. 3 and then moved to the lower SRD portion for processing in some embodiments.

The method 400 further includes dispensing a cleaning chemistry onto a surface of the substrate while the substrate rests upon a chuck of the cleaning module at block 402. The cleaning chemistry may be at a temperature elevated from an ambient temperature in some embodiments. For example, the cleaning chemistry may be at about 80 degrees Celsius in some embodiments. The method 400 further includes terminating dispensing of the cleaning chemistry after a predetermined time period at block 403. For example, the terminating may include closing, or directing to close, a valve controlling the flow of cleaning chemistry to the cleaning module or to a spray-head proximate the surface of the substrate. Upon termination of the dispensing of the cleaning chemistry, the method 400 further includes dispensing a fluid onto the surface of the substrate at block 404. The fluid may be referred to as a wetting agent. The dispensing may also be facilitated through a valve-controlled fluid transfer medium such as tubing or a spray-head. The dispensed fluid may be at or substantially near ambient temperature, e.g., about 20 degrees C., i.e., the temperature of the fluid/wetting agent is less than the temperature of the cleaning chemistry. The dispensed fluid may be a neutral chemistry, solvent, cooling fluid, or deionized water in some embodiments. It should be appreciated that the fluid dispensing of block 404 facilitates uniform temperature distribution across the surface of the substrate by cooling the center portion of the substrate over the chuck of the SRD module so that the temperature across the center portion of the substrate and the outer periphery of the substrate that extends past the edge of the chuck are at an equivalent temperature.

The method 400 further includes terminating dispensing of the fluid after a predetermined time period at block 405. For example, the terminating may include closing, or directing to close, a valve controlling the flow of the dispensed fluid to the cleaning module or to a spray-head proximate the surface of the substrate. In some embodiments, the fluid is dispensed onto the surface of the substrate for about 10 seconds to about 60 seconds. It should be appreciated that during the dry cycle, the substrate's outer periphery, about 3-inches from the edge of the substrate toward the substrate center, cools down at much faster rate as compared to the substrate area above the SRD chuck. At this time, the SRD chuck is still hot at about temperature of the dispensed cleaning chemistry. The hot SRD chuck radiates heat back to the substrate since the SRD chuck has mass and takes longer to cool down. The substrate surfaces contacting the SRD chuck stays at an elevated temperature for a longer time as compared to the portion of the substrate not contacting the chuck. The portion of the substrate that is at an elevated temperature around the center of the substrate does not get exposed to vapor condensation, but the substrate area where the SRD chuck has no contact, cools down to ambient and is exposed to vapor condensation, if the present embodiments for uniformly cooling the substrate are not applied. Vapor condensed on the substrate shows up as particles in the form of large ring around the periphery of the wafer where the present embodiments are not applied. In addition, without the present embodiments, vapors that condensed on SRD chamber walls and ceiling falls on top of substrate and is a source of particles. In order to eliminate the vapor from the chamber and have uniform temperature across the substrate, dispensing DIW or another fluid at room temperature for about 10-60 seconds upon termination of the dispensing of the heated chemistry but prior to beginning the dry cycle results in significant improvement in particle reduction. In addition, vapor condensation on the wall and ceiling of SRD chamber is reduced. The method 400 further includes rotating the substrate after terminating dispensing of the fluid at block 406. The rotating promotes drying of the substrate without deposition of particles due to the uniform temperature of the substrate.

Figure 5:
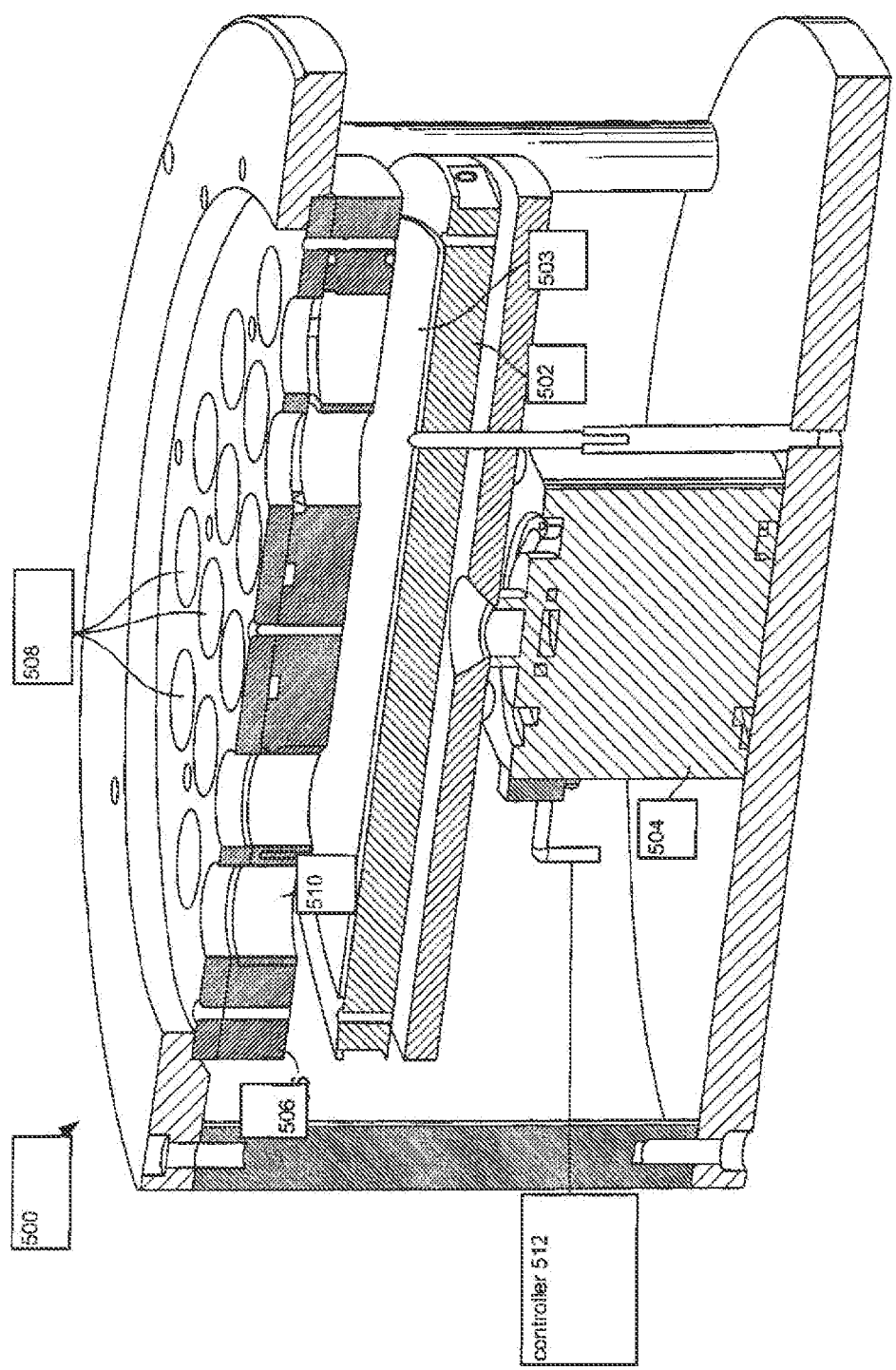
FIG. 5 is a simplified schematic of a cross sectional view of a processing module, according to some embodiments.

FIG. 5 is a cross sectional view of a combinatorial processing system in accordance with some embodiments of the invention. FIG. 5 illustrates system 500 that includes a reactor block 506 disposed over stage or chuck 502 which can secure substrate 503. Reactor block 506 defines an array of reactors 508, also referred to as reaction areas, that define a pattern of isolated reaction regions when sealed against a surface of substrate 503 for performing a process in each reaction region. System 500 includes a floating or removable reactor sleeve 510. Removable reactor sleeve 510 is configured to float or be dynamically positionable in each reactor 508 of the reactor block 506 in some embodiments. Use of the removable sleeves 510 in each reactor 508 allows for replacement of individual reactor walls that may become contaminated or otherwise unsuitable for continued use in a reactor. Piston 504 provides the force to raise substrate support or chuck 502 so that a surface of substrate 503 is forced against sealing surfaces of removable sleeves 510 in some embodiments. Controller 512 monitors and controls the force of the substrate 503 against the sealing surfaces in some embodiments. Controller 512 may be a general purpose computer or a special purpose computer.

Reactor sleeves 510 contact the substrate surface to isolate/contain chemistries during the combinatorial processing. Sleeves 510 may be compressed when substrate is clamped, i.e., as the substrate surface seals against a bottom sealing surface of the sleeves. Sleeves 510 are made of PTFE material in some embodiments. The PTFE may expand outward or relax back to its original shape as the pressure (force) is exerted or released during the clamping/unclamping the wafer. Due to the material properties of the sleeves 510, the sleeves have a tendency to expand outward at the contact points during the clamping step when pressure is exerted along the sleeve tube axis. Where the sleeves have some freedom to move prior to the chuck reaching its process position, the bottom sealing surface of the sleeve will contact the substrate and will expand and contract according to the application of the force. When the bottom surface of sleeves 510 is in contact with the substrate and expanding, e.g., during a clamping procedure, the surface of the sleeve grinds with the substrate surface. This grinding of the sleeve surface with the substrate surface leaves particle and contact marks on the surface of the substrate that are difficult to remove or may even require an additional process step to clean the substrate. The embodiments described below provide for lubricating the contact surface of sleeves 510 with a wetting agent, such as DIW, either via pre-wetting the wafer surface or pre-wetting the sleeves, thereby reducing particles and contact marks.

Similarly during an un-clamping step when chuck pressure is released, sleeves 510 relax back to its normal shape as the chuck moves away from the contact surface of the sleeves. While sleeves are relaxing back to its original shape and still in contact with the wafer, the contact surface of sleeves 510 is grinding on the substrate surface. During an un-clamping step, wafer moves away from sleeves and as the sealing surface of the sleeves relaxes to normal shape, the sealing surface grinds on the substrate surface and may cause particle and contact marks on the substrate surface. If the substrate surface in the reactor is wetted prior to un-clamping the substrate, the lubrication reduces particle counts and contact marks.

Figure 6:
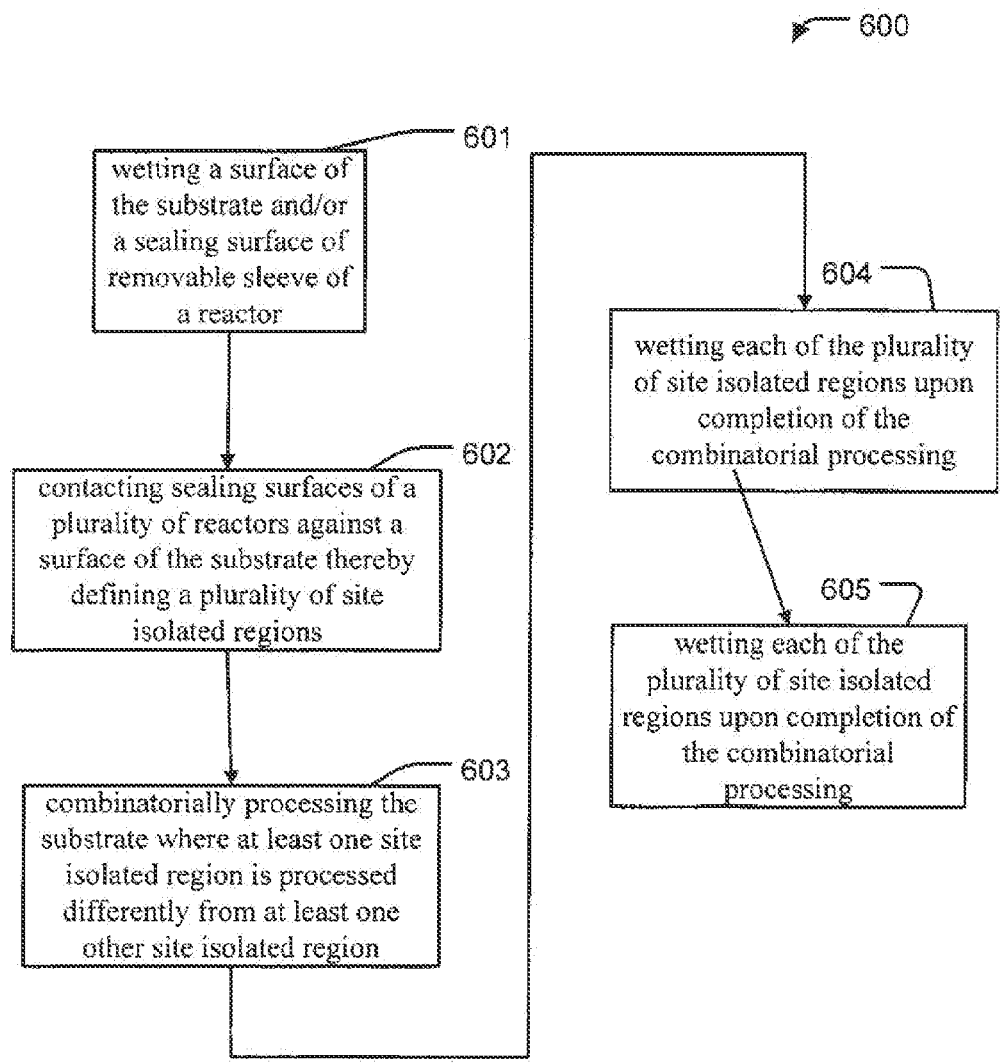
FIG. 6 illustrates a flowchart of a method of processing a substrate, according to some embodiments.

Turning to FIG. 6, a flowchart of a method 600 of processing a substrate is illustrated. The method includes wetting a surface of the substrate and/or a sealing surface of removable sleeve of a reactor at block 601. The wetting agent is DIW in some embodiments. The reactor may be configured as illustrated with reference to FIG. 5 so that combinatorial processing may be performed as described above. According to some embodiments, the processing apparatus may be a high throughput parallel processing reactor. The method 600 further includes contacting sealing surfaces of a plurality of reactors against a surface of the substrate thereby defining a plurality of site isolated regions at block 602. As noted above, a chuck may be raised so that the bottom surfaces of the removable sleeves seal against the substrate surface.

The method 600 further includes combinatorially processing the substrate where at least one site isolated region is processed differently from at least one other site isolated region at block 603. The combinatorial processing may be performed as described with reference to FIGS. 1 and 2 in some embodiments. The method further includes wetting each of the plurality of site isolated regions upon completion of the combinatorial processing at block 604. As mentioned above, the wetting agent may be DIW in some embodiments but is not limited to DIW as any suitable fluid may be utilized here. The method also includes removing the sealing surfaces of each of the plurality of reactors from the surface of the substrate at block 605.

It should be appreciated that during the combinatorial processing 604 the substrate may be clamped/unclamped several times. The clamping and unclamping includes sealing a surface of a sleeve of a reactor, or a cup, with a surface of the substrate, and removing the surface of the sleeve of the reactor from the surface of the substrate, respectively. During the clamping and unclamping the sealing surface expands and contracts, respectively, due to the forces acting of the reactor/cup and sealing sleeve. In order to control particles generated when a sealing surface of a sleeve/cup in a processing module contacts the substrate surface during the clamping and unclamping operations, a sealing surface of the sleeve/cup and/or the surface of the substrate contacting the sleeve may be wetted during the clamping and/or unclamping operations as described with reference to FIG. 6. The wetting agent provides lubrication between the sealing surface and the substrate surface during clamping and unclamping operations so that the surfaces do not grind together as compared to when the surfaces are non-lubricated. As noted above, the substrate and/or the sealing surface of the sleeve may be wetted prior to clamping and/or unclamping operations. Reducing the particles and contact marks provide the ability to avoid additional process step to remove sleeve contact marks and particles prior to re-inserting the processed substrates back in to the production line.

It should be appreciated that the wet interface between the sealing surface of the sleeve/cup and the substrate surface prior to making contact with the substrate surface or prior to releasing the contact reduces the particles and contact marks due to the grinding of the surfaces. When compared to existing methods and apparatuses, the embodiments described can provide rapid combinatorial processing techniques which increase productivity in research and development of new materials, coatings, and processing of semiconductor substrates and associated devices while reducing or mitigating the possibility of deposition of unwanted particles during or after a cleaning process due to uneven or disparate temperature ranges of equipment. The corresponding structures, materials, acts, and equivalents of all means plus function elements in any claims below are intended to include any structure, material, or acts for performing the function in combination with other claim elements as specifically claimed.

Those skilled in the art will appreciate that many modifications to the exemplary embodiments are possible without departing from the spirit and scope of the present invention. In addition, it is possible to use some of the features of the present invention without the corresponding use of the other features. Accordingly, the foregoing description of the exemplary embodiments is provided for the purpose of illustrating the principles of the present invention, and not in limitation thereof, since the scope of the present invention is defined solely by the appended claims.

What is claimed is:

1. A method for cleaning a substrate having a plurality of site isolated regions defined thereon, comprising the steps of:
   combinatorially processing the substrate where at least one site isolated region is processed differently from at least one other site isolated region;
   transferring the substrate to a cleaning module, wherein the substrate rests upon a chuck of the cleaning module, wherein the chuck has a diameter that is less than a diameter of the substrate so that a first portion of the substrate contacts the chuck and a second portion of the substrate does not contact the chuck;
   dispensing a cleaning chemistry onto a surface of the substrate while the substrate rests upon a chuck of the cleaning module, the cleaning chemistry being at a temperature elevated from an ambient temperature;
   dispensing a fluid onto the surface of the substrate, wherein a temperature of the fluid is at or substantially near the ambient temperature; and
   drying the surface of the substrate, wherein during said drying, the chuck radiates heat to the first portion of the substrate such that the second portion of the substrate cools down at a faster rate than the first portion of the substrate during the drying step.

2. The method of claim 1, wherein the dispensing the fluid comprises having the substrate stationary for a period of time with the fluid disposed thereon prior to the drying.

3. The method of claim 1, wherein the temperature of the cleaning chemistry is 80 degrees celsius.

4. The method of claim 1, further comprising
   eliminating vapor in the cleaning module.

5. The method of claim 1, further comprising
   reducing vapor condensation on a wall of the cleaning module.

6. The method of claim 2, wherein the cleaning chemistry comprises deionized water.

* * * * *